(12) United States Patent
Lim et al.

(10) Patent No.: US 12,406,927 B2
(45) Date of Patent: Sep. 2, 2025

(54) RF SWITCH DEVICE INCLUDING MULTI-WIDTH AIR GAPS

(71) Applicant: DB HiTek Co., Ltd., Bucheon-si (KR)

(72) Inventors: Ki Won Lim, Suwon-si (KR); Jin Hyo Jung, Suwon-si (KR); Hae Taek Kim, Bucheon (KR); Seung Hyun Eom, Seoul (KR); Ja Geon Koo, Eumseong-gun (KR); Hyun Joong Lee, Daejeon (KR); Sang Yong Lee, Chungju-si (KR)

(73) Assignee: DB HiTek Co., Ltd., Bucheon-si (KR)

( * ) Notice: Subject to any disclaimer, the term of this patent is extended or adjusted under 35 U.S.C. 154(b) by 551 days.

(21) Appl. No.: 17/730,495

(22) Filed: Apr. 27, 2022

(65) Prior Publication Data

US 2022/0367354 A1   Nov. 17, 2022

(30) Foreign Application Priority Data

May 12, 2021 (KR) .......................... 10-2021-0061299

(51) Int. Cl.
  *H10D 64/27*    (2025.01)
  *H01L 21/768*   (2006.01)
  *H01L 23/528*   (2006.01)
  *H01L 23/532*   (2006.01)

(52) U.S. Cl.
  CPC ...... *H01L 23/5283* (2013.01); *H01L 21/7682* (2013.01); *H10D 64/519* (2025.01); *H01L 21/76885* (2013.01); *H01L 23/5329* (2013.01)

(58) Field of Classification Search
  CPC ............ H01L 23/5283; H01L 23/5329; H01L 23/53295; H01L 23/5222; H01L 23/528; H01L 29/4238; H01L 29/0649; H10D 64/519; H10D 84/83
  See application file for complete search history.

(56) References Cited

U.S. PATENT DOCUMENTS

| | | | |
|---|---|---|---|
| 6,566,241 B2 | 5/2003 | Chun | |
| 6,890,828 B2* | 5/2005 | Horak | H01L 21/7682 |
| | | | 438/319 |
| 6,917,109 B2* | 7/2005 | Lur | H01L 23/5222 |
| | | | 257/758 |
| 7,553,756 B2* | 6/2009 | Hayashi | H01L 23/53252 |
| | | | 257/E21.573 |
| 9,653,347 B1* | 5/2017 | Leobandung | H01L 21/0217 |
| 9,865,594 B2* | 1/2018 | Siew | H01L 23/53295 |
| 10,535,607 B2* | 1/2020 | Saka | H10D 30/60 |
| 10,707,120 B1* | 7/2020 | Yami | H01L 21/76224 |
| 10,797,097 B2* | 10/2020 | Tanaka | H10F 39/8037 |
| 10,847,466 B2* | 11/2020 | Saka | H01L 23/53295 |

(Continued)

FOREIGN PATENT DOCUMENTS

KR  10-2002-0078310 A   10/2002
KR     20190134203 A  * 12/2019 ............ H01L 29/78

*Primary Examiner* — Ida M Soward
(74) *Attorney, Agent, or Firm* — Central California IP Group, P.C.; Andrew D. Fortney (57) ABSTRACT

An RF switch device in a stacked configuration and a method of manufacturing the same seek to reduce or eliminate a voltage imbalance, a condition in which different voltages are applied to different stages of the RF switch device, by forming air gaps on or over corresponding gate electrodes, in which each of the air gaps in a single stage has a different width.

4 Claims, 13 Drawing Sheets

(56) References Cited

U.S. PATENT DOCUMENTS

| | | | |
|---|---|---|---|
| 10,879,165 B2 * | 12/2020 | Saka | H01L 23/53295 |
| 11,205,609 B2 * | 12/2021 | Hsu | H01L 23/485 |
| 11,222,896 B2 * | 1/2022 | Hsu | H10B 12/315 |
| 11,270,945 B2 * | 3/2022 | Chang | H01L 23/535 |
| 11,322,395 B2 * | 5/2022 | Huang | H01L 23/5329 |
| 11,335,638 B2 * | 5/2022 | Singh | H01L 23/5226 |
| 11,929,380 B2 * | 3/2024 | Tanaka | H04N 25/79 |
| 2002/0146899 A1 | 10/2002 | Chun | |
| 2004/0097013 A1 | 5/2004 | Lur et al. | |
| 2015/0262929 A1 * | 9/2015 | Hsiao | H01L 21/7682 |
| | | | 438/618 |
| 2015/0287628 A1 * | 10/2015 | You | H01L 21/76816 |
| | | | 438/619 |
| 2016/0141240 A1 * | 5/2016 | Saka | H01L 29/41758 |
| | | | 257/288 |
| 2016/0293547 A1 * | 10/2016 | Rha | H01L 23/5222 |
| 2016/0308008 A1 * | 10/2016 | Yeo | H10D 30/024 |
| 2017/0330790 A1 * | 11/2017 | He | H01L 21/76805 |
| 2018/0277479 A1 | 9/2018 | Saka | |
| 2019/0279896 A1 * | 9/2019 | Singh | H01L 23/481 |
| 2021/0043569 A1 * | 2/2021 | Lu | H01L 23/528 |
| 2022/0216095 A1 * | 7/2022 | Singh | H01L 27/1203 |

* cited by examiner

RF SWITCH DEVICE INCLUDING MULTI-WIDTH AIR GAPS

CROSS REFERENCE TO RELATED APPLICATION(S)

The present application claims priority to Korean Patent Application No. 10-2021-0061299, filed on May 12, 2021, the entire contents of which are incorporated herein by reference.

TECHNICAL FIELD

The present disclosure relates to an RF switch device and a method of manufacturing the same and, more particularly, to an RF switch device in a stacked configuration and a method of manufacturing the same seeking to reduce or eliminate a voltage imbalance, a condition in which different voltages are applied to different stages or to different switches in a single stage, by forming air gaps having different widths on or over corresponding gate electrodes in a single stage.

BACKGROUND ART

High voltage RF switches are used to be utilized in a variety of applications, such as tuning of high voltage RF antennas. RF switches typically include a plurality of transistors stacked in a series configuration between an RF source and ground, and include a companion bias circuit for biasing nodes of the plurality of transistors. Although the stacked configuration of an RF switch is suitable for many applications, parasitic leakage currents may begin to flow in and out of the plurality of transistors at extremely high peak RF voltages. The parasitic leakage currents may change the designed bias voltage values of the bias circuit.

Figure 1:
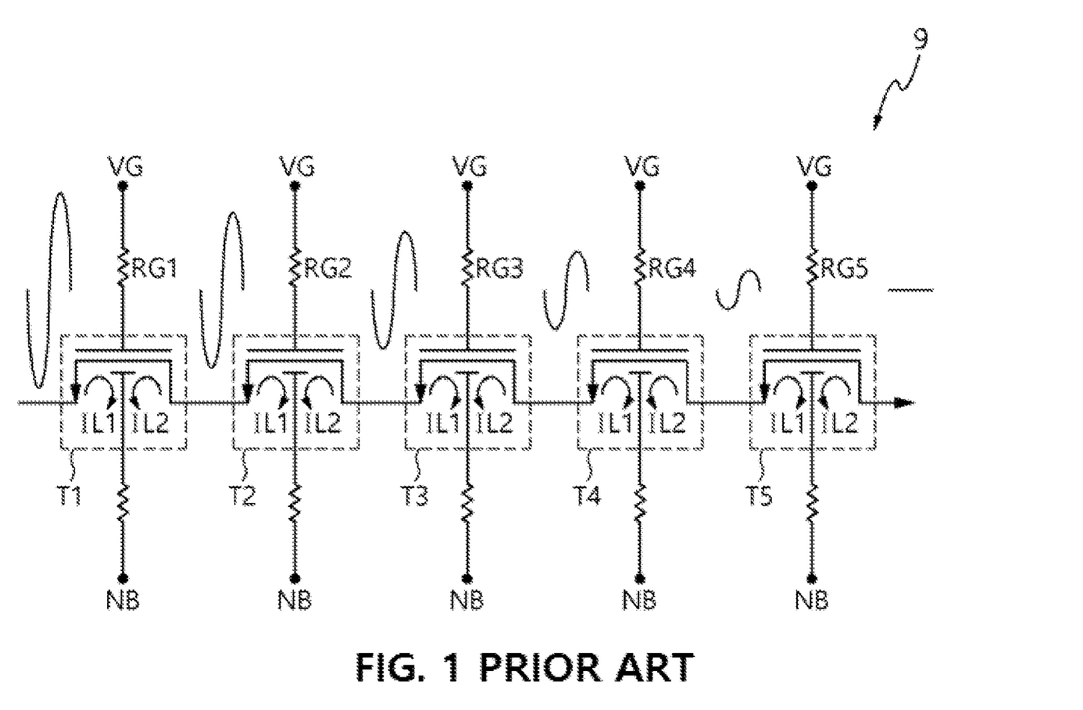
FIG. 1 is a schematic circuit diagram of a typical stacked RF switch device.

FIG. 1 is a schematic circuit diagram of a typical stacked RF switch device.

Referring to FIG. 1, a conventional stacked RF switch device 9 is designed to connect multiple transistors in series to increase the breakdown voltage of the individual transistors and enable the individual transistors to withstand the high voltage operating conditions associated with RF switching. To be specific, the stacked transistors T1, T2, . . . TN are connected in series with each other. The stacked transistors may be controlled by a control signal VG at the gates of the transistors T1, T2, . . . TN. The control signal VG may activate the transistors T1, T2, . . . TN through corresponding gate resistors RG1, RG2, . . . RGN. When the conventional RF switch device 9 is exposed to a high peak voltage at radio frequencies, parasitic leakage currents IL1 and IL2 flow from respective drain and source terminals to body terminals NB.

Therefore, in the stacked RF switch device 9, ideally, as the number of individual switches increases, the breakdown voltage of the device should increase in proportion to the number of switches. However, a voltage imbalance in which different voltages are applied to different switches or stages in the device 9 may occur due to leakage current, etc. In addition, as the number of switches in the device 9 increases, the actual measured breakdown voltage shows a greater difference from the ideal breakdown voltage (breakdown voltage×the number of switches in a single stage). That is, the efficiency inevitably decreases compared to the number of switches.

To solve such problems, the present disclosure concerns a novel RF switch device with an improved structure.

DOCUMENT OF RELATED ART

Korean Patent Application Publication No. 10-2002-0078310, entitled "METHOD FOR FORMING METAL CONTACT IN SEMICONDUCTOR DEVICE."

SUMMARY OF THE INVENTION

The present disclosure has been made to disclose solutions to the problems of the related art, and an objective of the present disclosure is to provide an RF switch device and a method of manufacturing the same that prevent a voltage imbalance, a condition in which different voltages are applied to individual stages in an RF switch by configuring the widths of air gaps on or over gate electrodes in a single stage to be different.

In addition, an objective of the present disclosure is to provide an RF switch device and a method of manufacturing the same that minimize parasitic capacitance in adjacent metal structures by configuring source extensions and adjacent drain extensions to not overlap along a first predetermined direction.

Technical Solution

The present disclosure may be implemented by embodiments having one or more of the following configurations in order to achieve one or more of the above-described objectives.

According to one or more embodiments of the present disclosure, an RF switch device of the present disclosure includes a semiconductor layer; gate electrodes spaced apart from each other on the semiconductor layer; sources in the semiconductor layer; drains in the semiconductor layer; lower source contacts connected to corresponding individual ones of the sources; a first lower metal structure connected to one of the lower source contacts; lower drain contacts connected to corresponding individual ones of the drains; a second lower metal structure connected to one of the lower drain contacts; and air gaps on or over the gate electrodes, wherein at least one of the air gaps has a different width than other ones of the air gaps.

According to one or more other embodiments of the present disclosure, in the RF switch device of the present disclosure, the air gaps may have at least two widths.

According to yet one or more other embodiments of the present disclosure, in the RF switch device, each of the air gaps may have a different width.

According to yet one or more other embodiments of the present disclosure, the RF switch device comprises a plurality of lower metal structures, and each air gap may be between adjacent ones of the lower metal structures.

According to yet one or more other embodiments of the present disclosure, the RF switch device may further include an upper source contact connected to the first lower metal structure; a first upper metal structure connected to the upper source contact; an upper drain contact connected to the second lower metal structure; and a second upper metal structure connected to the upper drain contact, wherein each of the air gaps may have an uppermost surface lower than a lowermost surface of the first and second upper metal structures.

According to yet one or more other embodiments of the present disclosure, an RF switch device includes a semiconductor layer; gate electrodes spaced apart from each other in a single stage and on the semiconductor layer; sources in the semiconductor layer; drains in the semiconductor layer; a lower source contact connected to one of the sources; a first lower metal structure connected to the lower source contact; an upper source contact connected to the first lower metal structure; a first upper metal structure connected to the upper source contact; a lower drain contact connected to one of the drains; a second lower metal structure connected to the lower drain contact; an upper drain contact connected to the second lower metal structure; a second upper metal structure connected to the upper drain contact; and air gaps configured such that, in the single stage and on each gate electrode, at least one of the air gaps has a different width than other ones of the air gaps, wherein the first upper metal structure may include a source tab extending along a first direction and a plurality of source extensions extending in a second direction from the source tab, the second drain metal structure may include a drain tab extending in the first direction and spaced apart from the source tab in the second direction and a plurality of drain extensions extending in the second direction from the drain tab, and the source extensions and the drain extensions do not overlap each other along the first direction.

According to yet one or more other embodiments of the present disclosure, each of the source extensions and the drain extensions may have a length equal to or less than half a distance between the source tab and the drain tab in the second direction.

According to yet one or more other embodiments of the present disclosure, the RF switch device may comprise multiple stages, including the single stage.

According to yet one or more other embodiments of the present disclosure, the air gaps within the single stage may have different widths to reduce or eliminate a voltage imbalance in the RF switch device.

According to yet one or more other embodiments of the present disclosure, the source extensions and the drain extensions may not overlap each other along the first direction.

According to one or more embodiments of the present disclosure, a method of manufacturing an RF switch device includes forming a gate insulating film on a semiconductor layer; forming a plurality of gate electrodes on the gate insulating film; forming a source and a drain in the semiconductor layer; forming a lower source contact on the source; forming a lower drain contact on the drain; forming a first lower metal structure on the lower source contact; forming a second lower metal structure on the lower drain contact; and forming air gaps, one each on or over a corresponding one of the gate electrodes, wherein the air gaps may have at least one width.

According to one or more other embodiments of the present disclosure, the method of manufacturing an RF switch device may further include forming a lower insulating film on the semiconductor layer; forming an intermediate insulating film on the lower insulating film; and forming an upper insulating film on the intermediate insulating film, wherein forming the air gaps may comprise forming a mask pattern exposing areas of the intermediate insulating layer in which individual ones of the air gaps are to be formed, and etching exposed areas of the intermediate insulating layer, wherein the exposed areas have at least one width.

According to yet one or more other embodiments of the present disclosure, in the method of manufacturing an RF switch device, the upper insulating film may be formed after forming the air gaps and may cover the air gaps.

According to yet one or more other embodiments of the present disclosure, in the method of manufacturing an RF switch device, the air gaps may have different widths.

According to yet one or more other embodiments of the present disclosure, a method of manufacturing an RF switch device includes forming a gate insulating film on a semiconductor layer; forming a plurality of gate electrodes on the gate insulating film; forming a source and a drain in the semiconductor layer; forming a lower insulating layer on the semiconductor layer; forming first contact holes in the lower insulating layer; forming a lower source contact and a lower drain contact in the first contact holes; forming first and second lower metal structures on the lower insulating layer; forming an intermediate insulating layer on the lower insulating layer; forming air gaps having non-uniform widths in the intermediate insulating layer; forming a first upper insulating layer on the intermediate insulating layer, the intermediate insulating layer covering the air gaps; forming second contact holes in the intermediate insulating layer and third contact holes in the first upper insulating layer; forming an upper source contact and an upper drain contact in the second contact holes and the third contact holes; and forming first and second upper metal structures on the upper insulating layer.

According to yet one or more other embodiments of the present disclosure, the method of manufacturing an RF switch device may further include forming a second upper insulating layer on the first upper insulating layer and the first and second upper metal structures.

According to yet one or more other embodiments of the present disclosure, in the method of manufacturing an RF switch device, the air gaps may have different widths.

Advantageous Effects

The present disclosure has the following effects by the above configurations.

The present disclosure can prevent a voltage imbalance, a condition in which the different voltages are applied to different individual stages or to different switches in a single stage in an RF switch by configuring the air gaps on or over gate electrodes in a single stage to have different widths.

In addition, the present disclosure can minimize parasitic capacitance caused by adjacent metal structures by configuring source extensions and adjacent drain extensions to not overlap along a first direction.

Meanwhile, it should be added that even if effects not explicitly mentioned herein, the effects described in the following specification expected by the technical features of the present disclosure and their potential effects are treated as if they were described in the specification of the present disclosure.

MODE FOR DISCLOSURE

Hereinafter, embodiments of the present disclosure will be described in more detail with reference to the accompanying drawings. The embodiments of the present disclosure may be modified in various forms, and the scope of the present disclosure should not be construed as being limited to the following embodiments, but should be construed based on the matters described in the claims. In addition, these embodiments are only provided for reference in order to more completely explain the present disclosure to those of ordinary skill in the art.

As used herein, the singular form may include the plural form unless the context clearly dictates otherwise. Furthermore, as used herein, "comprise" and/or "comprising" refers to the specific existence of the recited shapes, numbers, steps, actions, members, elements and/or groups thereof and does not exclude the presence or addition of one or more other shapes, numbers, actions, members, elements and/or groups.

In this specification, it should be noted that the individual components may be formed integrally or independently as necessary, and there is no limitation thereto.

Figure 4:
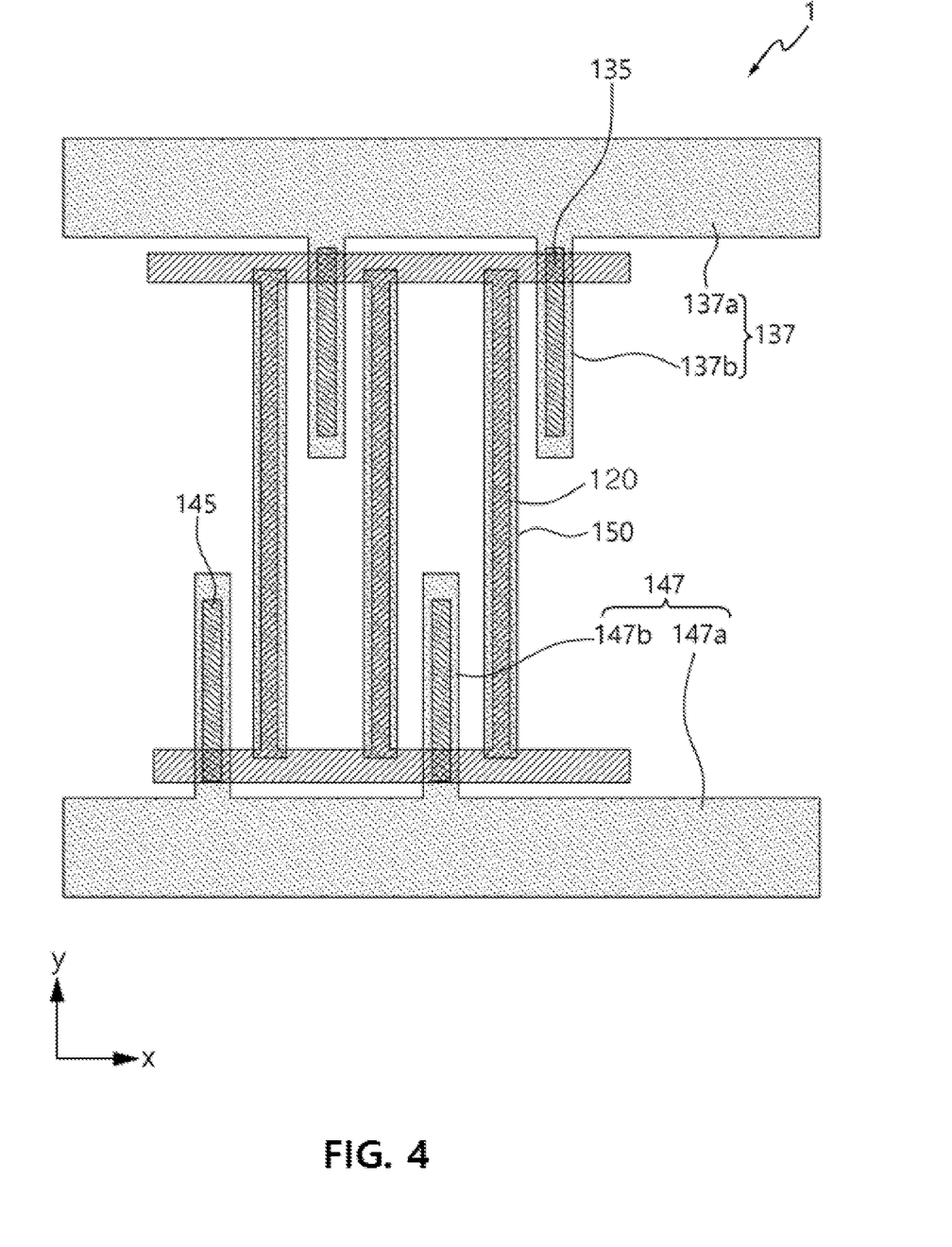
FIG. 4 is a schematic plan view of a single stage of an RF switch device according to one or more embodiments of the present disclosure.

In the plan view showing the present disclosure, the x-axis direction is referred to as a "first direction" and the y-axis direction is referred to as a "second direction" (see FIG. 4).

Figure 2:
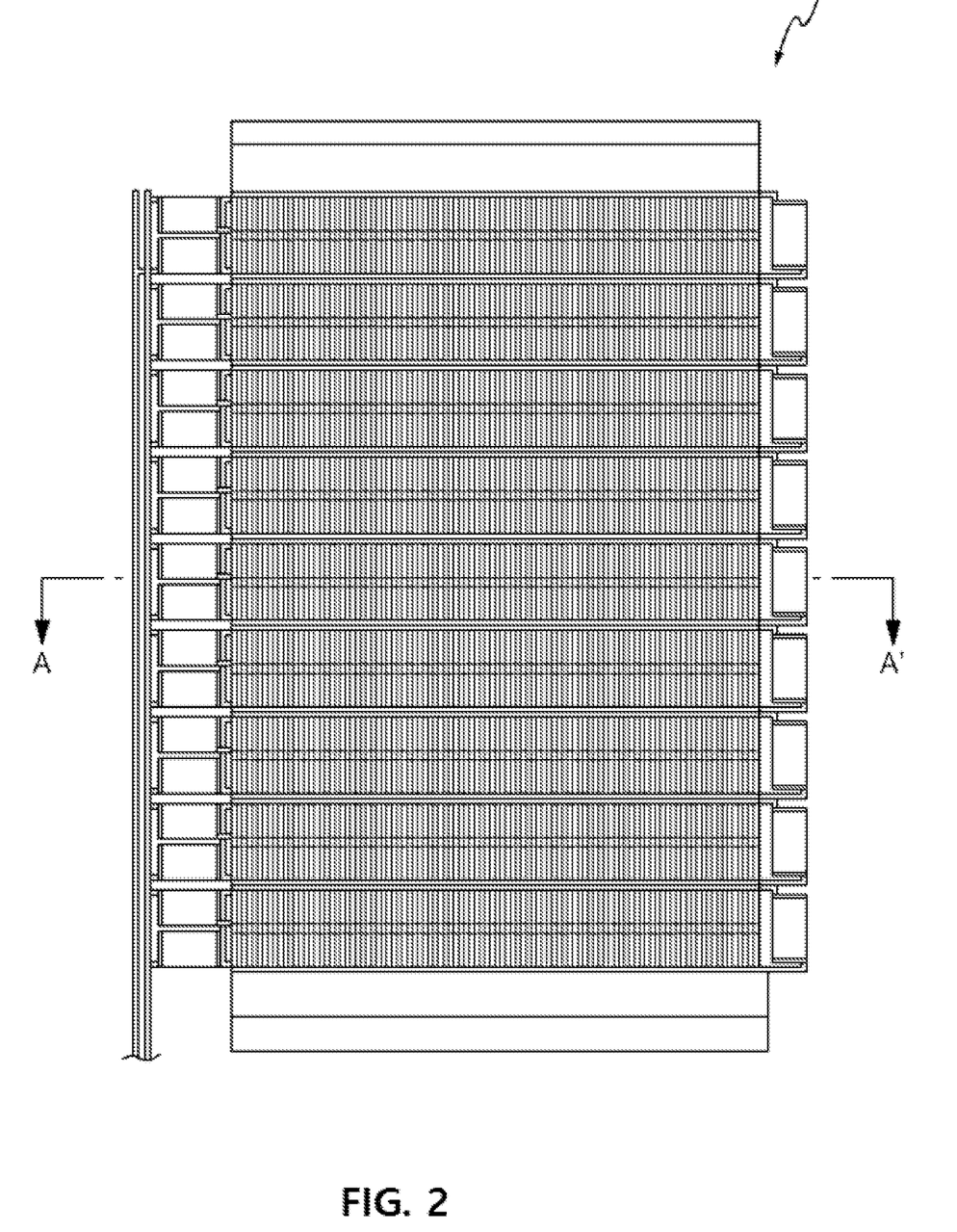
FIG. 2 is a plan view of an RF switch device according to one or more embodiments of the present disclosure.
Figure 3:
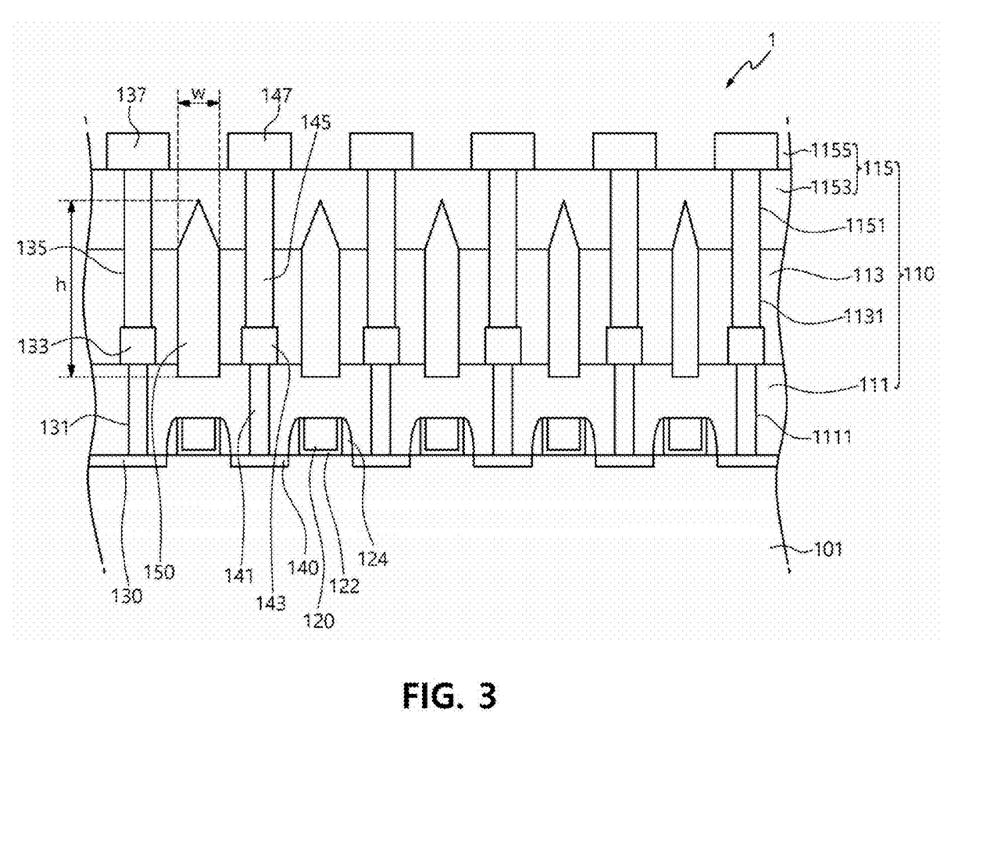
FIG. 3 is a cross-sectional view AA' of the RF switch device according to FIG. 2.

FIG. 2 is a plan view of an RF switch device according to one or more embodiments of the present disclosure, and FIG. 3 is a cross-sectional view AA' of the RF switch device according to FIG. 2.

Hereinafter, an RF switch device according to the present disclosure will be described in detail with reference to the accompanying drawings.

Referring to FIGS. 2 and 3, the present disclosure relates to an RF switch device 1 and, more particularly, to an RF switch device in a stacked configuration seeking to reduce or eliminate a voltage imbalance (e.g., a condition in which different voltages are applied to different stages) by forming air gaps having different widths on or over individual gate electrodes in a single stage or series of switches. Here, "stacked configuration" means that two or more transistors are connected in series to increase the breakdown voltage of the individual transistors to withstand the high voltage operating conditions associated with RF switching. The term "stage" refers to an individual stacked configuration or series circuit in the RF switch. For example, a first transistor, a second transistor, a third transistor, . . . and an nth transistor may be connected in series to form a stacked configuration, or a first stage, a second stage, a third stage, . . . and an nth stage may be connected in series to form a stacked configuration. In FIG. 2, a total of nine stages are illustrated, but there is no limitation thereto.

Referring to FIGS. 2 and 3, the RF switch device 1 has a structure in which a plurality of gate electrodes are spaced apart in a single stage in a first direction (e.g., a stripe type), and a plurality of stages may be stacked in a second direction. The second direction may be orthogonal to the first direction.

Hereinafter, the content of the configuration below the drain and the source in the active region will be omitted for convenience of description. For example, a drift region surrounding the drain and a body region surrounding the source may be below the drain and the source, respectively. A buried oxide (BOX) layer may be below the drift region and the body region.

A plurality of transistors are in or on a semiconductor layer 101. For example, the transistors may comprise field effect transistors. Each of the transistors may include a gate electrode 120, a source 130, and a drain 140, which will be described in detail below. In addition, the switch device 1 may have a multi-finger structure in or through which the transistors are electrically connected to each other. Also, an insulating layer 110 may be on or over the semiconductor layer 101, and the insulating layer 110 may comprise a plurality of individual insulating layers.

For example, the insulating layer 110 may comprise a lower insulating layer 111, an intermediate insulating layer 113, and an upper insulating layer 115. First contact holes 1111 for a lower source contact 131 and a lower drain contact 141 may be in the lower insulating layer 111, second contact holes 1131 for lower portions of an upper source contact 135 and an upper drain contact 145 may formed in the intermediate insulating layer 113, and third contact holes 1151 for upper portions of the upper source contact 135 and the upper drain contact 145 may be in the upper insulating layer 115.

The gate electrode 120 is on or above the semiconductor layer 101. In addition, a gate insulating film 122 is under the gate electrode 120 (e.g., between the gate electrode 120 and the substrate containing the source and drain). For example, the gate electrode 120 may have one end adjacent to the source 130, and another end adjacent to the drain 140. The gate electrode 120 may generally comprise at least one of conductive polysilicon, metal, conductive metal nitride, and combinations thereof, and may be formed by various known or to be known processes, such as CVD, PVC, ALD, MOALD, or MOCVD, and there is no limitation thereto. In addition, a gate spacer 124 that may comprise, for example, an oxide film, a nitride film, or a combination thereof may be on the outer (e.g., lateral) surface of the gate electrode 120 and/or the gate insulating film 122.

The source 130 is in the semiconductor layer 101 or in a layer of the substrate above the semiconductor layer 101. The source 130 is a high-concentration impurity region, and may have, for example, a second conductivity type (e.g., an n-type or a p-type). The source 130 is connected to the lower source contact 131. A first lower metal structure 133 is on and electrically connected to the lower source contact 131, an upper source contact 135 is on the first lower metal structure 133, and a first upper metal structure 137 are on or over the upper source contact 135. The lower source contact 131, the first lower metal structure 133, the upper source contact 135, and the first upper metal structure 137 may be in electrical communication with each other, and may comprise a metal such as copper, aluminum, or tungsten, but the scope of the present disclosure is not limited thereto.

In addition, for example, the lower source contact 131 may be in a first contact hole 1111 and the upper source contact 135 may be in a second contact hole 1131 and a third contact hole 1151, while the first lower metal structure 133 may be on the lower insulating layer 111 and the first upper metal structure 137 may be on the upper insulating layer 115.

The drain 140 may also be in the semiconductor layer 101 or in a layer of the substrate above the semiconductor layer 101 (e.g., the same layer as the source 130). The drain 140 is a high-concentration impurity region, and may also have the second conductivity type. A lower drain contact 141, a second lower metal structure 143, an upper drain contact 145, and a second metal upper structure 147 may be on or over the drain 140. The first and second lower metal structures 133 and 143 may be or comprise wires or lines in a first, relatively low layer of metallization, and the first and second upper metal structures 137 and 147 may be or comprise wires or lines in a second, relatively high layer of metallization. The lower drain contact 141, the first metal structure 143, the upper drain contact 145, and the second metal structure 147 have a structure substantially the same as or similar to that of the lower source contact 131, the first lower metal structure 133, the upper source contact 135, and the second metal layer 137, and thus a detailed description thereof will be omitted.

FIG. 4 is a schematic plan view of a single stage of an RF switch device according to an embodiment of the present disclosure.

Referring to FIG. 4, the first upper metal structure 137 includes a source tab 137a extending along a first direction; and a source extension 137b extending in a second direction from the source tab 137a. A plurality of source extensions 137b may be present, spaced apart from each other in the first direction. Each such source extensions 137b may have one side or end connected to the source tab 137a. The second upper metal structure 147 also includes a drain tab 147a corresponding to the source tab 137a; and a plurality of drain extensions 147b. The source tab 137a and the drain tab 147a are spaced apart from each other in the second direction.

As an example, each of the source extensions 137b and the drain extensions 147b may have a length less than or equal to half the distance (e.g., the shortest distance) between the source tab 137a and the drain tab 147a in the second direction. Accordingly, the source extension 137b and the drain extension 147b do not overlap each other along the first direction, and this may minimize parasitic capacitances between the first upper metal structure 137 and the adjacent second upper metal structure 147. That is, the individual source extensions 137b and drain extensions 147b may be in an alternating or "zigzag" pattern. Accordingly, the upper source contacts 135, the upper drain contacts 145, and the second and third contact holes 1131, 1151 may also be in an alternating or "zigzag" pattern, and there is no limitation thereto. It should be noted that the lower source contact, the lower drain contact, the first lower metal structure, and the second lower metal structure are not shown in FIG. 4 for convenience of description.

In addition, referring to FIG. 3, an air gap 150 (e.g., containing air) may be on or over each of the gate electrodes 120 and may have a predetermined width W and a height H. The air gap 150 is a configuration that lowers the parasitic capacitance between the first lower metal structure 133 and the second lower metal structure 143.

Hereinafter, the structure of the conventional RF switch device and problems thereof, and the configuration of the air gap 150 according to embodiments of the present disclosure for solving these problems will be described in detail.

Referring to FIG. 1, the conventional RF switch device 9 is designed to connect multiple transistors in series to increase the breakdown voltage of the individual transistors to withstand the high voltage operating conditions associated with RF switching. To be specific, the stacked transistors T1, T2, . . . TN are connected in series with each other. The stacked transistors may be controlled by a control signal VG at the gates of the transistors. The control signal VG may activate the gates of the transistors T1, T2, . . . TN through the gate resistors RG1, RG2, RGN. When the conventional RF switch device 9 is exposed to a high peak voltage at radio frequencies, parasitic leakage currents IL1 and IL2 may flow from drain and source terminals to body terminals NB.

Therefore, in the stacked RF switch device 9, ideally, as the number of individual switches increases, the breakdown voltage of the device should increase in proportion to the number of switches. However, a voltage imbalance in which different voltages are applied to different switches or stages in the device 9 may occur due to leakage current, etc. In addition, as the number of switches in the device 9 increases, the actual measured breakdown voltage shows a greater difference from the ideal breakdown voltage (breakdown voltage×the number of switches in a single stage). That is, the efficiency inevitably decreases compared to the number of switches.

To solve such problems, in the present disclosure, the width W of each air gap 150 above the individual gate electrodes 120 in a single stage or series is different (e.g., from the other air gaps in the stage or series). For example, parasitic capacitances may be adjusted by adjusting the width W of at least one of the air gaps 150 on or over the gate electrodes 120 in a single stage or series. Accordingly, it is possible to adjust the impedance of each switch within a single stage, and to control the voltage applied to each stage or switch. Thus, the voltage imbalance of the switch device may be adjusted.

Furthermore, when the switch device 1 is implemented in this way, the advantage is that there is no need to provide a separate compensation circuit including a capacitor to solve the conventional problems.

FIGS. 5 to 13 are cross-sectional views for reference for explaining a method of manufacturing an RF switch device according to one or more embodiments of the present disclosure.

Hereinafter, a method of manufacturing an RF switch device according to the present disclosure will be described in detail with reference to the accompanying drawings. It should be noted that each process may be performed differently from the order described below, for example, a first process and a second process may be performed opposite to the order described, or they may be performed substantially simultaneously.

Figure 5:
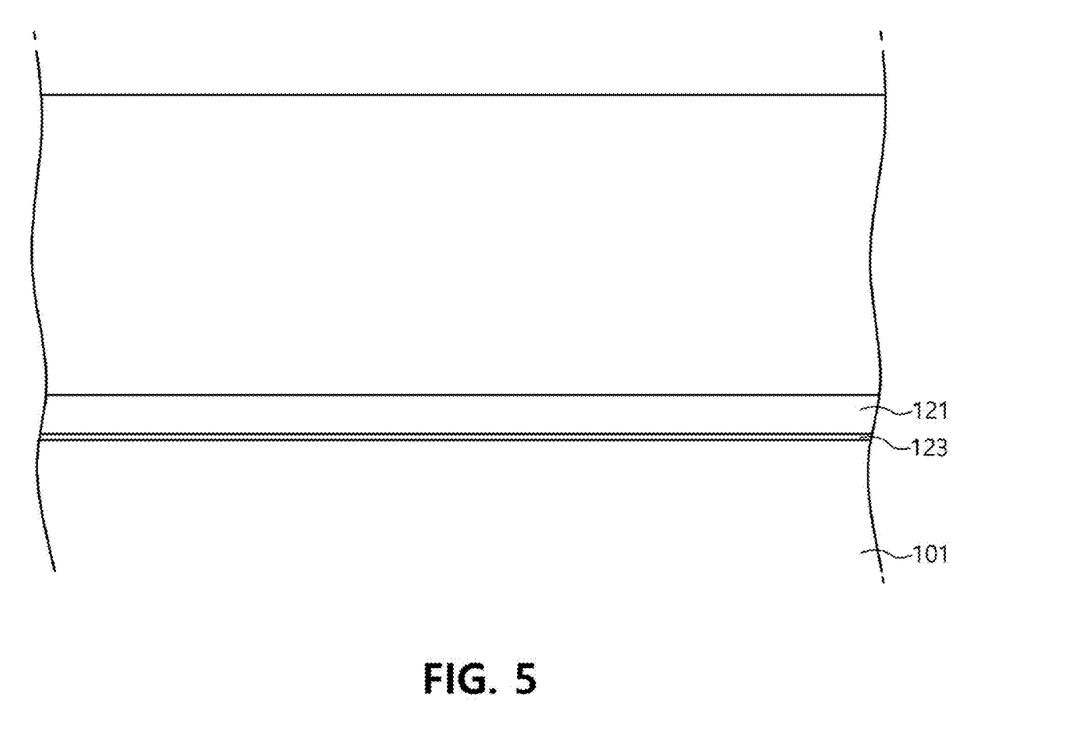
FIGS. 5 to 13 are cross-sectional views for reference for explaining a method of manufacturing an RF switch device according to one or more embodiments of the present disclosure.
Figure 6:
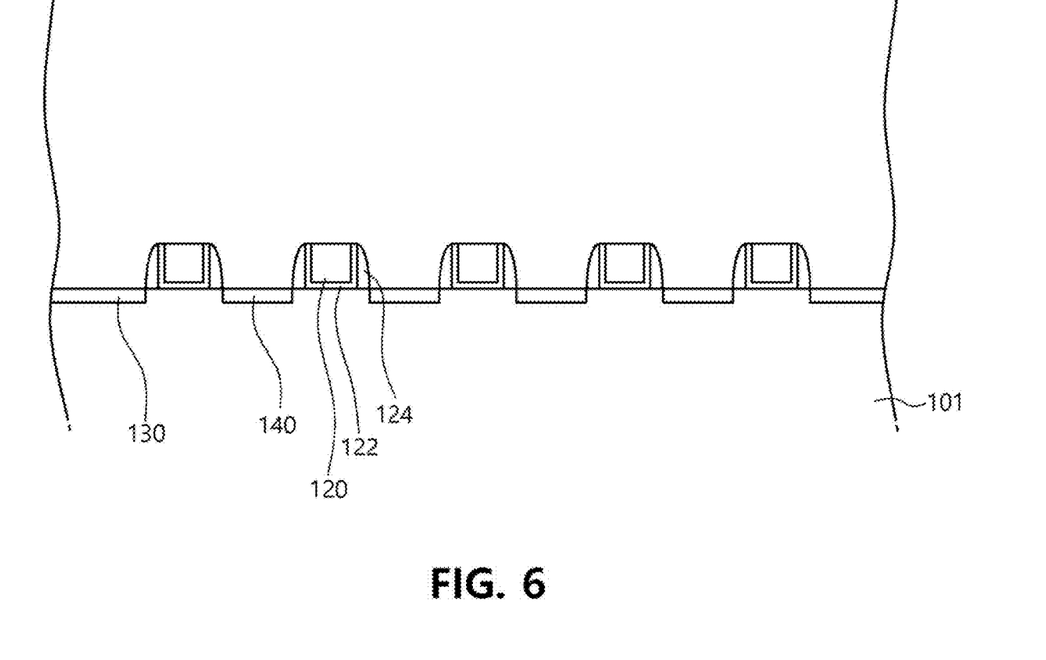

First, referring to FIGS. 5 and 6, the gate insulating film 122 and the gate electrode 120 are formed on or over the semiconductor layer 101. For example, an insulating layer 123 for forming the gate insulating film 122 and a polysilicon film 121 for forming the gate electrode 120 are sequentially deposited on the semiconductor layer 101. Alternatively, the insulating layer 123 and the polysilicon film 121 may be deposited onto an epitaxial layer grown (not numbered) on the semiconductor layer 101. Then, a mask pattern (not shown) is formed on the polysilicon film 121 by conventional photolithography and development, and the exposed polysilicon film 121 and insulating layer 123 are etched by conventional dry or wet etching. Thereafter, the gate spacer 124 is conventionally formed on the outer (lateral) surfaces of the gate electrode 120 (e.g., by blanket deposition of one or more insulating layers, followed by anisotropic etching).

In addition, referring to FIG. 6, the source 130 and the drain 140 are formed. For example, the source 130 and the drain 140 may be formed (e.g., simultaneously) by an ion implantation process. In this case, the gate electrode 120 may be used as an ion implantation mask, but the scope of the present disclosure is not limited thereto.

Figure 7:
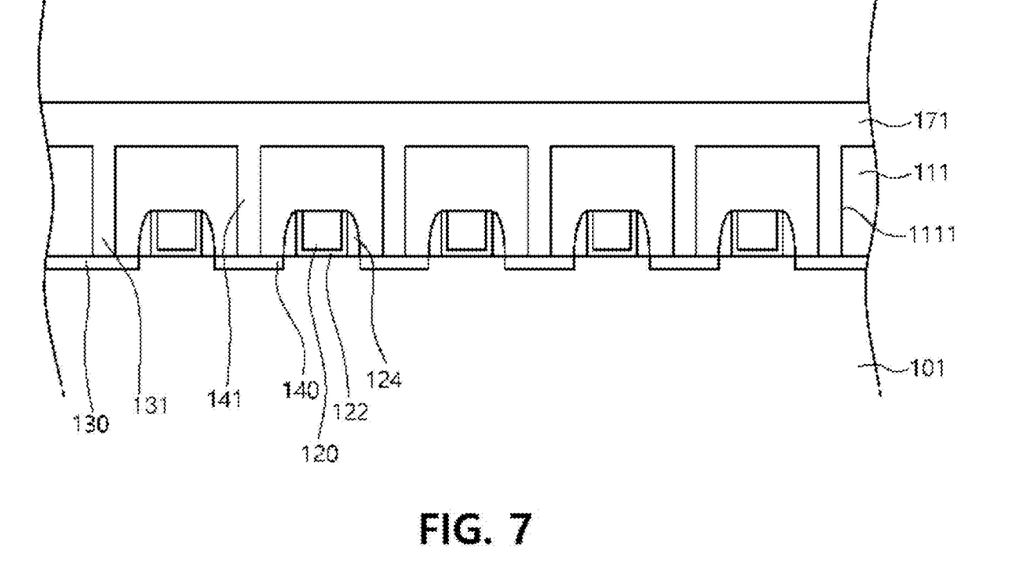

Thereafter, referring to FIG. 7, the lower insulating layer 111 is deposited on the semiconductor layer 101. Optionally, the lower insulating layer 111 is planarized by chemical mechanical polishing (CMP). After forming a mask pattern (not shown) on the lower insulating layer 111 so as to open positions where the lower source contact 131 and the lower drain contact 133 are to be formed, the exposed areas of the lower insulating layer 111 are etched to form the first contact holes 1111.

The lower source contact 131 and the lower drain contact 141 (comprising, for example, a metal such as copper, aluminum, or tungsten) are formed in the first contact holes 1111. For example, a first metal layer 171 is formed on the lower insulating layer 111 to fill the first contact holes 1111. Then, a planarization process is performed on the first metal layer 171 (e.g., by metal CMP) to expose upper surfaces of the lower source contact 131 and the lower drain contact 141.

Figure 8:
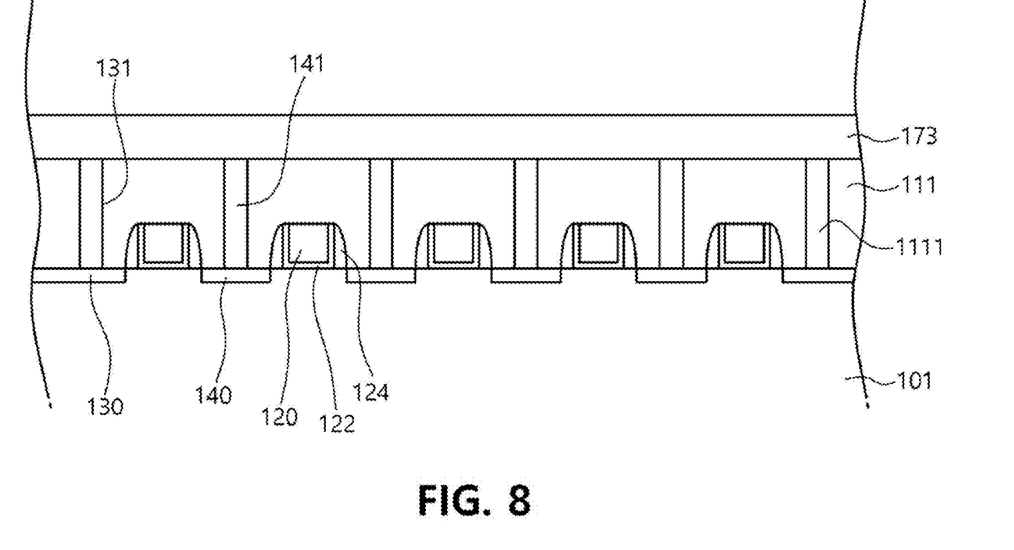

Thereafter, referring to FIG. 8, after depositing a second metal layer 173 on the lower insulating layer 111, a mask pattern (not shown) is formed on the second metal layer 173 and an etching process is performed to form the first lower metal structure 133 and the second lower metal structure 143.

Figure 9:
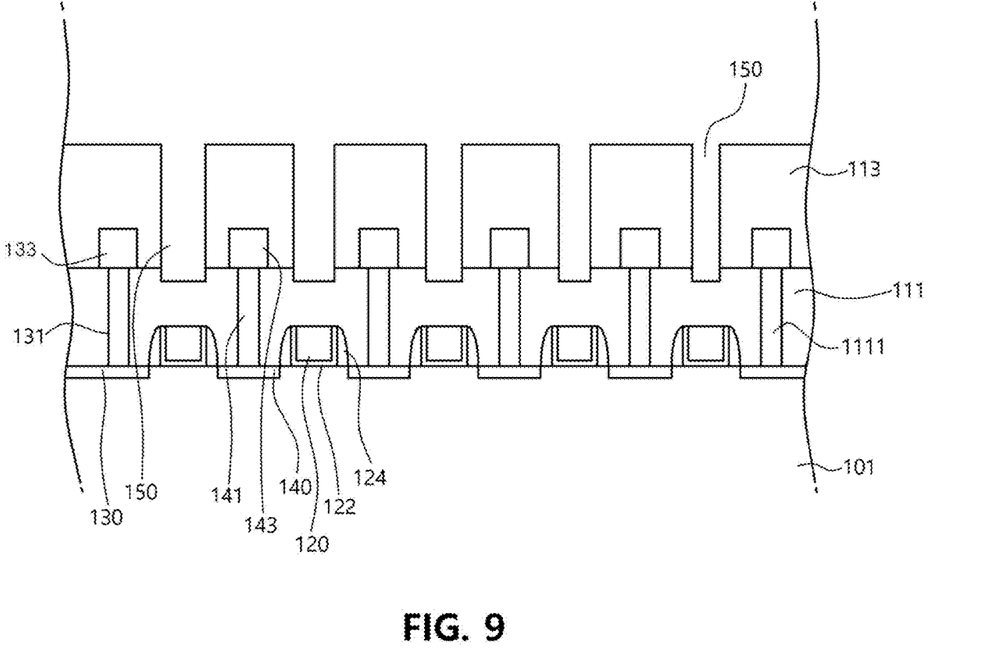

Thereafter, referring to FIG. 9, the intermediate insulating layer 113 is deposited on the lower insulating layer 111 and the first and second lower metal structures 133 and 143. In addition, after forming a mask pattern on the intermediate insulating layer 113, another etching process may be performed to form the air gaps 150. The air gaps 150, as described above, may be formed in multiple numbers within a single stage, and in the single stage, at least one air gap 150 has a different width W from the other air gaps 150 in the stage. The widths W of the air gaps 150 may differ as a result of forming openings with different widths in the mask pattern (not shown) on the intermediate insulating layer 113. Accordingly, it is possible to control the parasitic capacitance between adjacent structures in the lower metal layer to a desired level. It is preferable to understand that the different widths W of the air gaps 150 correspond to differences in width outside the error range or margin in the process (e.g., of forming the mask pattern and/or of etching the intermediate insulating layer 113).

Figure 10:
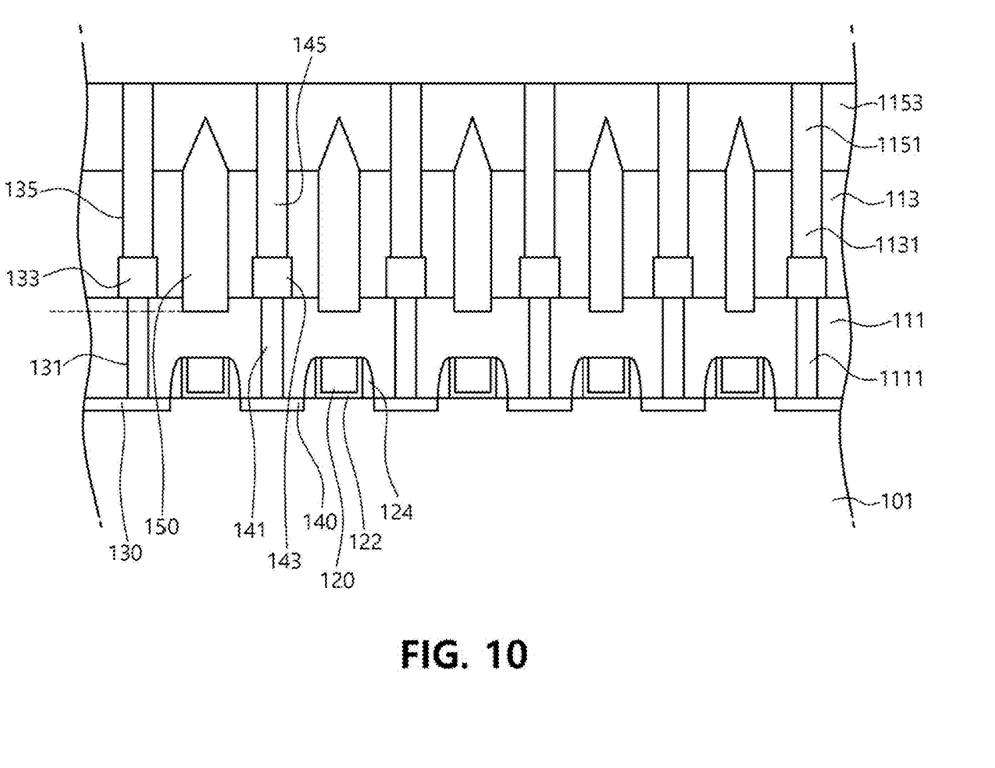

Thereafter, referring to FIG. 10, after forming a first upper insulating layer 1153 on the intermediate insulating layer 113 (e.g., so as not to fill the air gaps 150) and forming a mask pattern (not shown) for formation of the upper source contact 135 and the upper drain contact 145, another etching process is performed to form the second contact holes 1131 and the third contact holes 1151.

Figure 11:
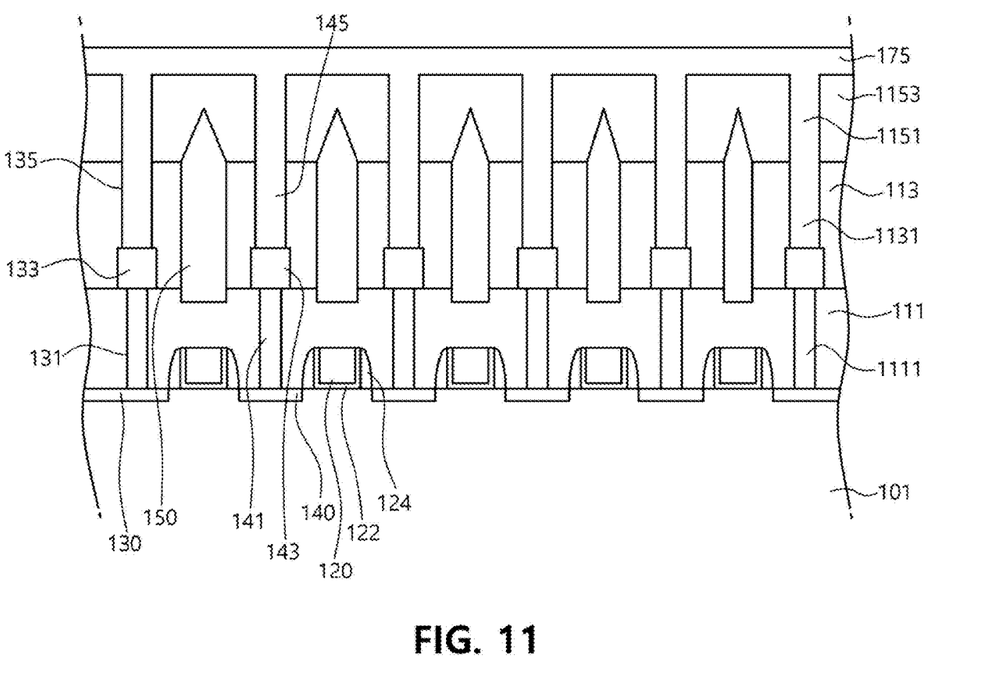

Thereafter, referring to FIG. 11, a third metal layer 175 is formed on the first upper insulating layer 1153 to fill the second and third contact holes 1131 and 1151. Then, another planarization process (e.g., metal CMP) is performed on the third metal layer 175 to expose upper surfaces of the upper source contacts 135 and the upper drain contacts 145.

Figure 12:
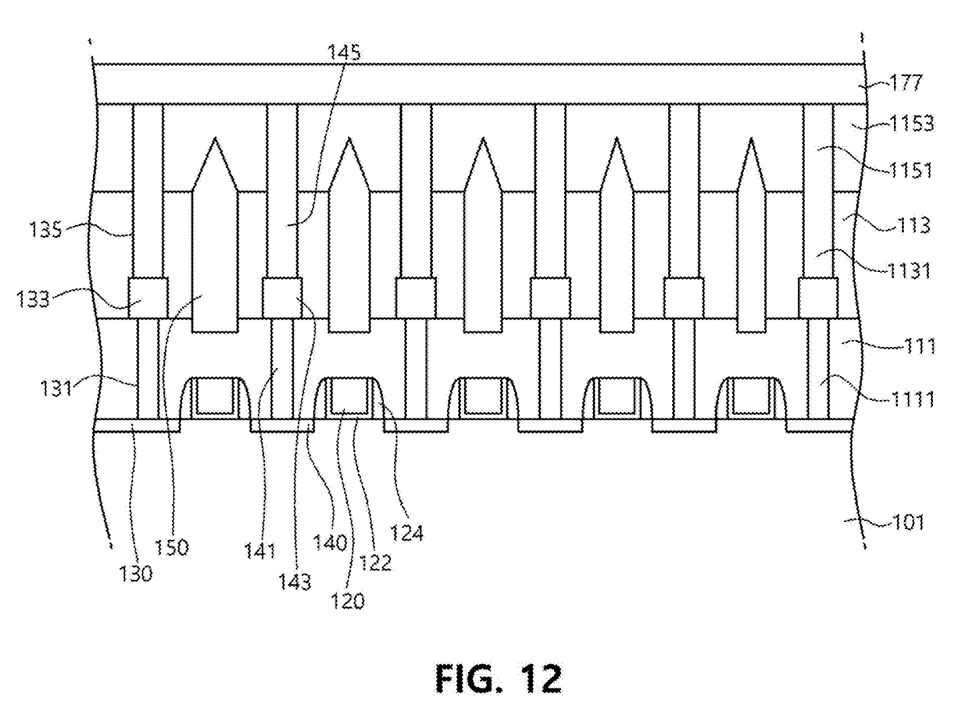

Thereafter, referring to FIG. 12, after depositing a fourth metal layer 177 on the first upper insulating layer 1153 and forming a mask pattern (not shown) on the fourth metal layer 177, the first upper metal structure 137 and the second upper metal structure 147 may be formed by etching.

Figure 13:
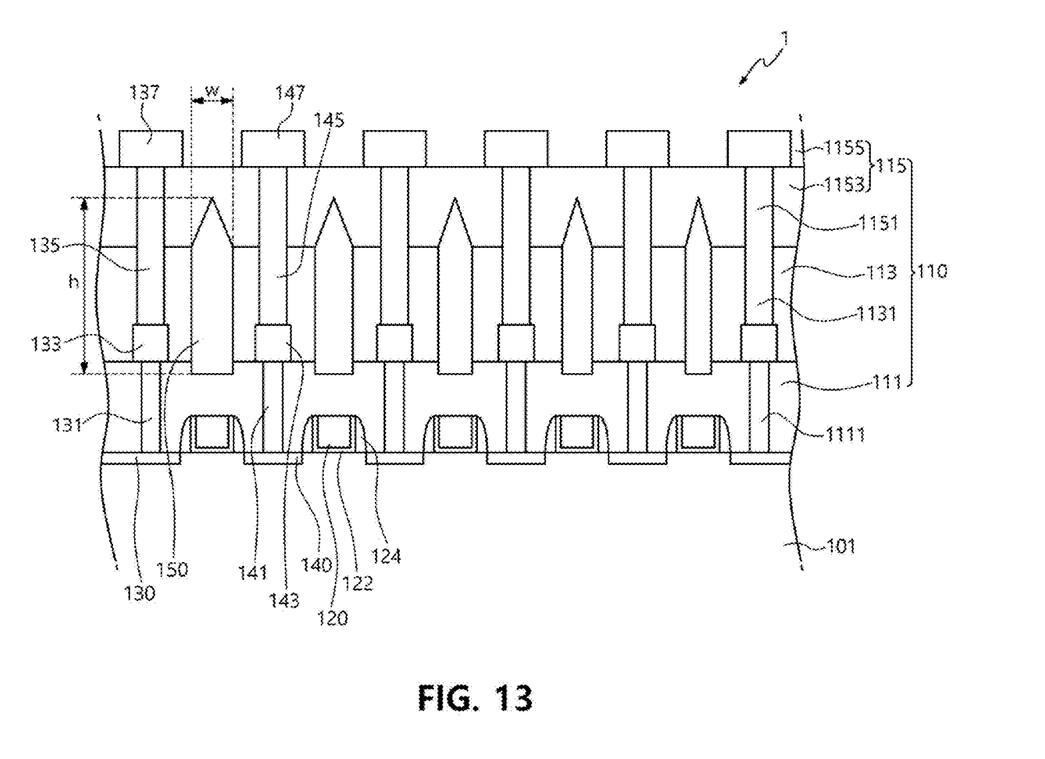

Thereafter, referring to FIG. 13, a second upper insulating layer 1155 is deposited on the first upper insulating layer 1153 and the first and second upper metal structures 137 and 147.

The above detailed description is illustrative of the present disclosure. In addition, the above description shows and describes preferred embodiments of the present disclosure, and the present disclosure can be used in various other combinations, modifications, and environments. That is, changes or modifications are possible within the scope of the concept of the disclosure disclosed herein, the scope equivalent to the written disclosure, and/or within the scope of skill or knowledge in the art. The above-described embodiments describe various states for implementing the technical idea(s) of the present disclosure, and various changes for specific application field(s) and use(s) of the present disclosure are possible. Accordingly, the detailed description of the present disclosure is not intended to limit the present disclosure to the disclosed embodiments.

The invention claimed is:

1. An RF switch device, comprising:
a semiconductor layer;
gate electrodes spaced apart from each other in a single stage and on the semiconductor layer;
sources in the semiconductor layer;
drains in the semiconductor layer;
a lower source contact connected to one of the sources;
a first lower metal structure connected to the lower source contact;
an upper source contact connected to the first lower metal structure;
a first upper metal structure connected to the upper source contact;
a lower drain contact connected to one of the drains;
a second lower metal structure connected to the lower drain contact;
an upper drain contact connected to the second lower metal structure;
a second upper metal structure connected to the upper drain contact; and
air gaps configured such that, in the single stage and on or over each gate electrode, at least one of the air gaps has a different width than other ones of the air gaps,
wherein the first upper metal structure includes:
a source tab extending along a first direction; and
a plurality of source extensions extending in a second direction from the source tab,
the second upper metal structure includes:
a drain tab extending in the first direction and spaced apart from the source tab in the second direction; and
a plurality of drain extensions extending in the second direction from the drain tab, and
each of the source extensions and the drain extensions has a length less than half a distance between the source tab and the drain tab in the second direction.

2. The RF switch device of claim 1, comprising multiple stages, the multiple stages including the single stage.

3. The RF switch device of claim 2, wherein the air gaps within the single stage have different widths to reduce or eliminate a voltage imbalance in the RF switch device.

4. The RF switch device of claim 1, wherein the source extensions and the drain extensions do not overlap each other along the first direction.

* * * * *